United States Patent
Sung et al.

(10) Patent No.: US 6,423,473 B1
(45) Date of Patent: Jul. 23, 2002

(54) FABRICATION METHOD OF HIGH TEMPERATURE SUPERCONDUCTING STEP-EDGE JOSEPHSON JUNCTION

(75) Inventors: Gun Yong Sung; Jun Sik Hwang; Kwang Yong Kang, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/389,458

(22) Filed: Sep. 3, 1999

(30) Foreign Application Priority Data

Nov. 23, 1998 (KR) .............................. 98-50247

(51) Int. Cl.[7] .......................... G03F 7/00; C23C 14/34
(52) U.S. Cl. .................. 430/311; 430/313; 430/314; 430/318; 505/329
(58) Field of Search ................... 430/311, 313, 430/314, 318; 505/329, 237; 257/32

(56) References Cited

U.S. PATENT DOCUMENTS

| | | | |
|---|---|---|---|
| 5,064,748 A | * 11/1991 | Bobbio | 430/311 |
| 5,525,582 A | 6/1996 | Tanaka et al. | 505/190 |
| 5,612,290 A | 3/1997 | Tanaka et al. | 505/190 |
| 5,618,446 A | * 4/1997 | Nagaishi | 216/65 |
| 5,661,112 A | * 8/1997 | Hatta et al. | 505/237 |
| 5,667,650 A | * 9/1997 | Face et al. | 204/298.07 |
| 5,721,196 A | * 2/1998 | Nakamura et al. | 505/237 |
| 5,750,474 A | * 5/1998 | Sung et al. | 505/329 |
| 5,801,393 A | * 9/1998 | Sung et al. | 257/32 |
| 5,945,383 A | * 8/1999 | Hunt | 505/329 |
| 6,004,907 A | * 12/1999 | Suh et al. | 505/329 |

OTHER PUBLICATIONS

"Substrate step-edge $TBa_2Cu_3O_7$ rf SQUIDs", by K. P. Daly et al, appearing in Appl. Phys. Lett. 59 (5), Feb. 4, 1991, pp. 543–545, (0003–6951/91/0505443–03, © 1991 Amer. Inst. of Physics).

"Improved Process for High–$T_c$Superconducting step–edge junctions", by J.Z. Sun et al, appearing in Appl. Phys. Lett. 63 (11), Sep. 13, 1993, pp. 1561–1563.

"Improved Step edges on $LaAlO_3$ substrates by using amorphous carbon etch masks", by H. R. Yi et al, appearing in Appl. Phys. Lett. 65 (9), Aug. 29, 1994, pp. 1177–1179.

* cited by examiner

Primary Examiner—Janet Baxter
Assistant Examiner—Yvette M. Clarke
(74) Attorney, Agent, or Firm—Antonelli, Terry, Stout & Kraus, LLP

(57) ABSTRACT

A method for fabricating a high temperature superconducting step-edge Josephson junction includes the steps of: (i) preparing a step-edge on an $SrTiO_3$ (STO) substrate; (ii) depositing a $YBa_2Cu_3O_{7-x}$ (YBCO) thin film on the step-edge substrate obtained; and (iii) forming a micro-bridge pattern on the, deposited metal thin film by photolithography and ion milling and then performing a heat treatment. This makes it possible to fabricate a step edge having a linear portion inclined at a large angle with good reproducibility during the ion-milling step. Furthermore, the two-stepped process of post heat treatment is carried out after the metal electrode of the junction is formed so that the high temperature superconducting step-edge junction can have its own characteristics enhanced.

20 Claims, 2 Drawing Sheets

FABRICATION METHOD OF HIGH TEMPERATURE SUPERCONDUCTING STEP-EDGE JOSEPHSON JUNCTION

BACKGROUND OF THE INVENTION

1. Field of the Invention

The present invention generally relates to a high temperature superconducting step-edge Josephson junction and its fabricating method and, more particularly, to a step-edge junction using a copper oxide high-temperature superconductor thin film and its fabricating method.

2. Description of the Related Art

In a case where a step-edge junction is fabricated by depositing a superconductor thin film at a step edge that is previously formed on a single crystalline substrate, a portion of the thin film grown on an inclined surface of the step edge has a different crystal orientation from a portion of the thin film grown on the portions above and below the step. As a result, grain boundaries are formed in the upper and lower portions of the inclined surface of the step edge.

In fabrication of the step-edge Josephson junction, the most important thing is to prepare highly inclined and linear steps with good reproducibility on a single crystalline substrate.

Therefore, in the prior art, many substances have been proposed for an ion-milling mask to be used in the fabrication of steps, including Nb (See. K. P. Daly et al., Applied Physic Letters, Vol. 58(5), pp 543–545 (1991)), diamond-like carbon (DLC) (See. J. Z. Sun et al., Applied Physics Letters, Vol. 63(11), pp 1561–1563 (1993)) and amorphous carbon thin film (See. H. R. Yi et al., Applied Physic Letters, Vol. 65(9), pp 1177–1179 (1994), etc.

Alternatively, the step edge to be used for fabrication of a step-edge junction on a single substrate can be prepared by a method using NaCl and CaO thin films (See. Subura Tanaka et al., U.S. Pat. No. 5,525,582 (1997)) or using a $PrBa_2Cu_3O_{7-x}$ (PBCO) thin film (See. Takao Nakamura et al., U.S. Pat. No. 5,721,196 (1998)).

However, there still remains a problem involving a low reproducibility because the related art step edge is fabricated using a separate ion-milling mask or by a complicated process of fabrication.

SUMMARY OF THE INVENTION

It is therefore an object of the present invention to provide a method for fabricating a high temperature superconducting step-edge junction with good reproducibility for use purpose as the high-speed and high-frequency devices for communications.

To achieve the above object, there is provided a method for fabricating a high temperature superconducting step-edge Josephson junction including the steps of: (i) preparing a step-edge on a substrate; (ii) depositing a metal thin film on the step-edge substrate obtained; and (iii) forming a micro-bridge pattern on the deposited metal thin film by photolithography and ion milling and then performing a heat treatment.

BRIEF DESCRIPTION OF THE DRAWINGS

The above and other objects, features and advantages of the present invention will become more apparent from the following detailed description when taken in conjunction with the accompanying drawings in which like reference numerals indicate like parts. In the drawings.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

Now, a description will be with reference to FIGS. 1 to 6 as to a process for fabricating a step-edge Josephson junction.

Figure 1:
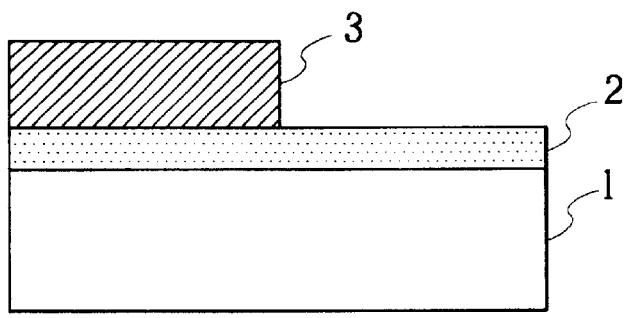
FIGS. 1 through 6 are flow diagrams illustrating a process for fabricating a step-edge Josephson junction.

In a first step, as shown in FIG. 1, a 30–50 nm Au film 2 is deposited on an $SrTiO_3$ (STO) single crystalline substrate 1 in a heat deposition machine and an AZ5214E photoresist 3 is then coated at 5200 rpm for 30 seconds in a spin coating machine. After soft-baked at 90° C. for 20 min on a hot plate, the resulting material is subjected by photolithography in order to make the form of a step-edge substrate.

A contact portion between the photoresist 3 and the substrate 1 is slightly undercut in a case where the photoresist 3 undergoes the photolighography on the substrate 1. This results from reflection of lights from the bottom surface of the transparent substrate 1 during an exposure.

As the photoresist 3 is undercut, there happens that the matters came off the substrate 1 during an ion milling are deposited at the bottom of the substrate 1 again.

Figure 2:
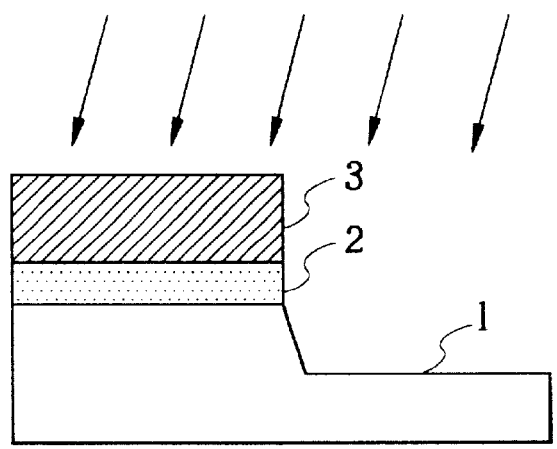

Referring to FIG. 2, there is shown a diagrammatic sectional view illustrating a step of performing an ion milling in the fabrication of a step edge on the single crystalline substrate 1.

The single crystalline substrate 1 is adhered to a holder with a silver paste adhesive and then ion-milled under the condition as shown in Table 1.

TABLE 1

| | |
|---|---|
| Ion Beam Source | Ar |
| Pressure of Chamber | $8 \times 10^{-4}$ Torr |
| Ion Beam Current | 30 mA |
| Ion Beam Voltage | 350 V |
| Rotatory Speed of Substrate | 1 rpm |

Figure 3:
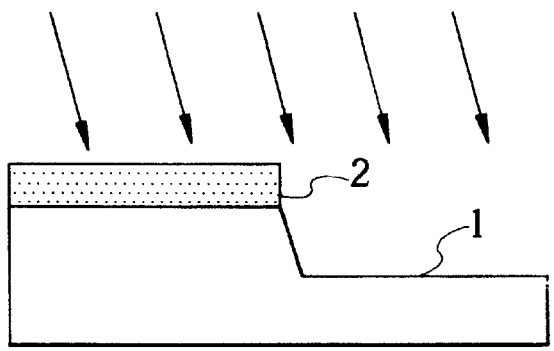

Referring to FIG. 3, there is shown a diagrammatic sectional view illustrating a step of removing the photoresist 3 and the Au thin film 2 remaining on a portion above the substrate 1. The photoresist 3 is removed in acetone and the Au film 2 is ion-milled again under the condition of Table 1.

Figure 4:
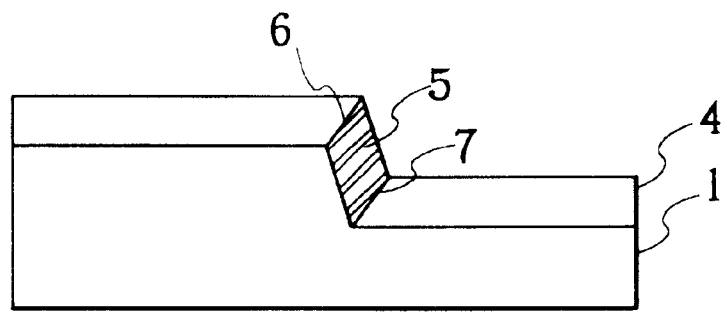

In a second step, as shown in FIG. 4, on the step-edge substrate 1 thus obtained is deposited an oxide superconductor thin film 4 to form an a-axis-oriented $YBa_2Cu_3O_{7-x}$ (YBCO) film 5 so that upper and lower grain boundaries 6 and 7 are obtained.

The oxide superconductor thin film 4 is deposited to a height being ⅔ of the step height above the step edge by a pulse laser deposition under the condition as shown in Table 2. For example, the oxide superconductor thin film 4 is deposited as thick as 100 to 150 nm under the condition of Table 2.

TABLE 2

| | |
|---|---|
| Deposition Temperature | 820° C. |
| Oxygen Pressure | 100 mTorr |

TABLE 2-continued

| Thickness of Thin Film | 100–150 nm |
|---|---|
| Excimer Laser Condition | 5 Hz, 1 J/cm² |
| Rotatory Speed of Target | 10 rpm |

Figure 5:
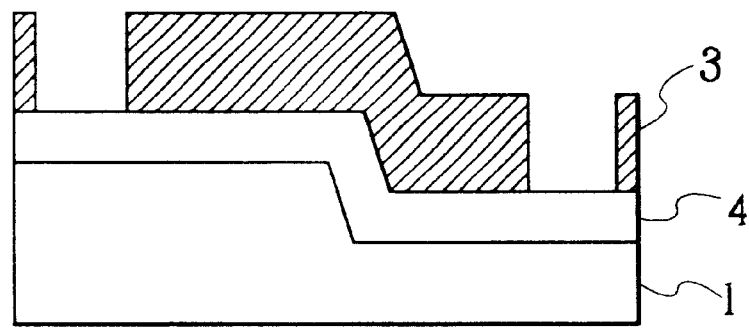

In a third step, as shown in FIG. 5, the oxide superconductor thin film 4 deposited is dry-etched in the micro-bridge form to prepare a metal electrode and then subjected to a heat treatment.

Following the dry etching of the oxide superconductor thin film 4 into a micro-bridge pattern, the resulting material is patterned into a metal electrode 2 in a lift-off manner of the photolithography step. The metal electrode 2 thus obtained is deposited to have a thickness of 200 nm by a pulse laser deposition method under the condition as shown in Table 3.

TABLE 3

| Deposition Temperature | Normal Temperature |
|---|---|
| Oxygen Pressure | $10^{-3}$ mTorr |
| Thickness of Thin Film | 200 nm |
| Excimer Laser Condition | 5 Hz, 2 J/cm² |
| Rotatory Speed of Target | 10 rpm |

Figure 6:
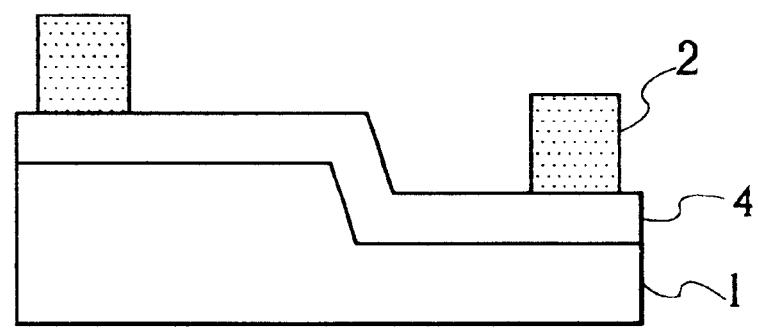

After deposition of the metal electrode 2, the photoresist is removed in acetone to complete a device as shown in FIG. 6.

To recover the damages on the thin film that are caused during the process, the device is subjected to a heat treatment under the condition as shown in Table 4.

TABLE 4

| | Primary Heat Treatment | Secondary Heat Treatment |
|---|---|---|
| Heat Treatment Temperature | 820° C. | 470° C. |
| Oxygen Pressure | 500 Torr | 500 Torr |
| Heat Treatment Duration | 30 min | 1 hr |

The primary heat treatment is to rearrange the atoms in the upper and lower grain boundaries of the step-edge junction, disordered in the photolithography and ion milling steps.

The device is subjected to the secondary heat treatment for 1 hr and then cooled in order to supplement oxygens come off the high temperature superconductor thin film.

As described above, the present invention provides a method for fabricating a high temperature superconducting step-edge Josephson junction using a metal (Au) thin film for shielding the light reflected from the bottom surface of the substrate during the step of exposure. This makes it possible to fabricate a step edge having a linear portion inclined at a large angle with good reproducibility during the ion-milling step. Furthermore, the two-stepped process of post heat treatment is carried out after the metal electrode of the junction is formed so that the high temperature superconducting step-edge junction can have its own characteristics enhanced.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for fabricating a high temperature superconducting step-edge Josephson junction on a substrate, said method comprising the steps of:

(i) preparing a step-edge on a substrate by:
  (a) depositing a metal thin film on the substrate;
  (b) after deposition of the metal thin film, applying a photoresist and using the photoresist as a mask to perform photolithography and ion milling so as to etch the metal thin film and a portion of the substrate to obtain a step-edge on the substrate; and
  (c) removing the photoresist and the metal thin film remaining on the top surface of the substrate after the photolithography and the ion milling;

(ii) depositing an oxide superconductor thin film on the step-edge obtained; and (iii) forming a micro-bridge pattern on the deposited oxide superconductor thin film by photolithography and ion milling and then performing a heat treatment.

2. The method as claimed in claim 1, wherein the metal thin film corresponds to an Au metal film for shielding the light reflected from a bottom surface of the substrate during exposure.

3. The method as claimed in claim 1, wherein in the substep (c), the photoresist is removed by acetone and the metal thin film undergoes the ion milling performed under a specified condition including an ion beam source, a pressure of chamber, an ion beam current and an ion beam voltage.

4. The method as claimed in claim 3, wherein the metal thin film undergoes the ion milling performed with an Ar ion beam source at a chamber pressure of $8 \times 10^{-4}$ Torr, an ion beam current of 30 mA, an ion beam voltage of 350 V, and a rotational speed of the substrate of 1 rpm.

5. The method as claimed in claim 3, wherein after patterning by a lift-off method, a metal electrode is prepared by depositing the metal thin film exhibiting a thickness of 200 nm at a normal temperature for the deposition temperature, an oxygen pressure of $10^{-3}$ mTorr, an excimer laser condition of 5 Hz and 2 J/cm², and a rotational speed of target of 10 rpm.

6. The method as claimed in claim 1, wherein the oxide superconductor thin film is deposited to a thickness ⅔ of the step height by a pulse laser deposition.

7. The method as claimed in claim 6, wherein the oxide superconductor thin film is deposited to a thickness of 100–150 nm at a deposition temperature of 820° C., an oxygen pressure of 100 mTorr, an excimer laser condition of 5 Hz and 1 J/cm², and a rotational speed of target of 10 rpm.

8. The method as claimed in claim 6, wherein the oxide superconductor thin film is used to form an axis-oriented $YBa_2Cu_3O_{7-x}$ (YBCO) film so that upper and lower grain boundaries at the step-edge junction are obtained.

9. The method as claimed in claim 1, wherein the step (iii) comprises the substeps of:

(a) performing a primary heat treatment of the deposited oxide superconductor thin film to rearrange atoms in upper and lower grain boundaries at the step-edge junction, disordered during the photolithography and the ion milling after deposition of the metal thin film; and (b) performing a secondary heat treatment of the deposited oxide superconductor thin film and cooling the heated oxide superconductor thin film.

10. The method as claimed in claim 9, wherein the primary heat treatment is performed at a temperature of 820° C. and an oxygen pressure of 500 Torr for 30 minutes.

11. The method as claimed in claim 9, wherein the secondary heat treatment is performed at a temperature of 470° C. and an oxygen pressure of 500 Torr for 1 hour.

12. A method for fabricating a high temperature superconducting step-edge Josephson junction on a substrate, said method comprising the steps of:

depositing a metal thin film on the substrate;

depositing a photoresist and using the photoresist as a mask to etch the metal thin film and a portion of the substrate so as to form a step edge of the substrate;

removing the photoresist and the metal thin film remaining on the top surface of the substrate;

depositing an oxide superconductor thin film on the step-edge of the substrate; and forming a micro-bridge pattern on the deposited oxide superconductor thin film by photolithography, ion milling and heat treatment.

13. The method as claimed in claim 12, wherein the metal thin film corresponds to an Au metal film for shielding the light reflected from a bottom surface of the substrate during exposure.

14. The method as claimed in claim 12, wherein the photoresist is removed by acetone and the metal thin film undergoes ion milling performed with an Ar ion beam source at a chamber pressure of $8 \times 10^{-4}$ Torr, an ion beam current of 30 mA, an ion beam voltage of 350 V, and a rotational speed of the substrate of 1 rpm.

15. The method as claimed in claim 12, wherein after patterning by a lift-off method, a metal electrode is prepared by depositing the metal thin film exhibiting a thickness of 200 nm at a normal temperature for the deposition temperature, an oxygen pressure of $10^{-3}$ mTorr, an excimer laser condition of 5 Hz and 2 J/cm², and a rotational speed of target of 10 rpm.

16. The method as claimed in claim 12, wherein the oxide superconductor thin film is deposited to a thickness ⅔ of the step height by a pulse laser deposition.

17. The method as claimed in claim 16, wherein the oxide superconductor thin film is deposited to a thickness of 100–150 nm at a deposition temperature of 820° C., an oxygen pressure of 100 mTorr, an excimer laser condition of 5 Hz and 1 J/cm², and a rotational speed of target of 10 rpm.

18. The method as claimed in claim 16, wherein the oxide superconductor thin film is used to form an axis-oriented $YBa_2Cu_3O_{7-x}$ (YBCO) film so that upper and lower grain boundaries at the step-edge junction are obtained.

19. The method as claimed in claim 12, wherein the micro-bridge pattern is formed by:

(a) performing a primary heat treatment of the deposited oxide superconductor thin film to rearrange atoms in upper and lower grain boundaries at the step-edge junction, disordered during the photolithography and the ion milling after deposition of the metal thin film; and (b) performing a secondary heat treatment of the deposited oxide superconductor thin film and cooling the heated oxide superconductor thin film.

20. The method as claimed in claim 19, wherein the primary heat treatment is performed at a temperature of 820° C. and an oxygen pressure of 500 Torr for 30 minutes, and the secondary heat treatment is performed at a temperature of 470° C. and an oxygen pressure of 500 Torr for 1 hour.

* * * * *